US012557715B2

(12) United States Patent
Omagari et al.

(10) Patent No.: US 12,557,715 B2
(45) Date of Patent: Feb. 17, 2026

(54) SEMICONDUCTOR DEVICE (71) Applicant: Mitsubishi Electric Corporation, Tokyo (JP)

(72) Inventors: Yuya Omagari, Tokyo (JP); Shuhei Yokoyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 610 days.

(21) Appl. No.: 17/937,498

(22) Filed: Oct. 3, 2022

(65) Prior Publication Data

US 2023/0170284 A1    Jun. 1, 2023

(30) Foreign Application Priority Data

Nov. 29, 2021   (JP) ................. 2021-193302

(51) Int. Cl.
*H01L 23/495*   (2006.01)
*H01L 23/31*    (2006.01)
(Continued)

(52) U.S. Cl.
CPC .... *H01L 23/49575* (2013.01); *H01L 23/3107* (2013.01); *H01L 23/49513* (2013.01); *H01L 23/49562* (2013.01); *H01L 23/49568* (2013.01)

(58) Field of Classification Search
CPC ........... H01L 23/49575; H01L 23/3107; H01L 23/49513; H01L 23/49562;
(Continued)

(56) References Cited

U.S. PATENT DOCUMENTS

2007/0215999 A1*  9/2007  Kashimoto ........... H01L 21/565
                                                        257/E21.504
2013/0334672 A1* 12/2013  Denta ................... H01L 23/495
                                                        438/123
(Continued)

FOREIGN PATENT DOCUMENTS

JP   2002083927 A  *  3/2002  ............. H01L 23/50
JP   2018-107364 A     7/2018
JP   2021-144984 A     9/2021

OTHER PUBLICATIONS

Nagura, Hidaeki JP 2002083927 A—Attached Machine Translation (Year: 2002).*

(Continued)

*Primary Examiner* — Omar F Mojaddedi
(74) *Attorney, Agent, or Firm* — Studebaker Brackett PLLC (57) ABSTRACT A semiconductor device includes a power semiconductor element, and a molding resin sealing the power semiconductor element. In plan view, the molding resin has a rectangular shape consisting of a first side and a second side extending along a first direction, and a third side and a fourth side extending along a second direction orthogonal to the first direction. The first side is longer than the third side. The molding resin is provided with a first threaded bore and a second threaded bore, the first threaded bore and the second threaded bore penetrating the molding resin along a third direction orthogonal to the first direction and the second direction.

8 Claims, 4 Drawing Sheets (51) Int. Cl.
*H01L 23/367* (2006.01)
*H01L 23/433* (2006.01)
*H01L 25/075* (2006.01)

(58) Field of Classification Search
CPC .......... H01L 23/49568; H01L 23/4334; H01L 23/49541; H01L 23/3672; H01L 23/3114; H01L 23/3121; H01L 23/4006; H01L 25/072
See application file for complete search history.

(56) References Cited

U.S. PATENT DOCUMENTS

| | | | | |
|---|---|---|---|---|
| 2016/0218050 | A1* | 7/2016 | Yoshihara | ............ H01L 23/3735 |
| 2018/0109249 | A1* | 4/2018 | Suh | .................... H01L 23/49579 |
| 2018/0182719 | A1 | 6/2018 | Muto et al. | |
| 2020/0395343 | A1* | 12/2020 | Kakefu | .................... H01L 24/49 |
| 2021/0134706 | A1* | 5/2021 | Hanada | ................. H01L 23/482 |

OTHER PUBLICATIONS

An Office Action; "Notice of Reasons for Refusal," mailed by the Japanese Patent Office on Oct. 8, 2024, which corresponds to Japanese Patent Application No. 2021-193302 and is related to U.S. Appl. No. 17/937,498.

* cited by examiner

SEMICONDUCTOR DEVICE

BACKGROUND OF THE INVENTION

Field of the Invention

The present disclosure relates to a semiconductor device.

Description of the Background Art

A semiconductor device is described, for example, in Japanese Patent Laying-Open No. 2018-107364. The semiconductor device described in Japanese Patent Laying-Open No. 2018-107364 has an insulated gate bipolar transistor (IGBT), a freewheeling diode, and a sealing body.

The IGBT and the freewheeling diode are sealed in the sealing body. In plan view, the sealing body has a rectangular shape consisting of a first side and a second side extending along a first direction, and a third side and a fourth side extending along a second direction orthogonal to the first direction. The sealing body is provided with a first threaded bore and a second threaded bore. An imaginary line (first imaginary line) passing through the center of the first threaded bore in the second direction and the center of the second threaded bore in the second direction is along the first direction, and also passes through the center of the sealing body in the second direction. The semiconductor device described in Japanese Patent Laying-Open No. 2018-107364 is attached to a heat dissipation device when screws are threaded into the first threaded bore and the second threaded bore and the screws are screwed into the heat dissipation device.

In plan view, the IGBT is located in the vicinity of the first imaginary line. In plan view, the freewheeling diode is located, on the other hand, farther away from the first imaginary line toward the second side than the IGBT.

SUMMARY OF THE INVENTION

An IGBT and a freewheeling diode may be integrated into a single chip. In other words, a reverse conducting IGBT (RC-IGBT) may be used instead of the IGBT and the freewheeling diode. In this case, in the semiconductor device described in Japanese Patent Laying-Open No. 2018-107364, an imaginary line (second imaginary line) passing through the center of the reverse conducting IGBT in the second direction and being along the first direction may be displaced from the first imaginary line, resulting in insufficient heat dissipation when screwed to the heat dissipation device.

The present disclosure has been made in view of the problem associated with prior art techniques as described above. More specifically, the present disclosure provides a semiconductor device capable of achieving improved heat dissipation when screwed to a heat dissipation device.

A semiconductor device according to the present disclosure includes a power semiconductor element, and a molding resin sealing the power semiconductor element. In plan view, the molding resin has a rectangular shape consisting of a first side and a second side extending along a first direction, and a third side and a fourth side extending along a second direction orthogonal to the first direction. The first side is longer than the third side. The molding resin is provided with a first threaded bore and a second threaded bore, the first threaded bore and the second threaded bore penetrating the molding resin along a third direction orthogonal to the first direction and the second direction. A first imaginary line extends along the first direction, and is closer to the second side than a center of the molding resin in the second direction, the first imaginary line passing through a center of the first threaded bore in the second direction and a center of the second threaded bore in the second direction. A distance between a second imaginary line and the first imaginary line is less than or equal to 2 mm, the second imaginary line passing through a center of the power semiconductor element in the second direction and extending along the first direction.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

First Embodiment

A semiconductor device according to a first embodiment is described. The semiconductor device according to the first embodiment is referred to as a semiconductor device 100.

(Configuration of Semiconductor Device 100)

The configuration of semiconductor device 100 is described below.

Figure 1:
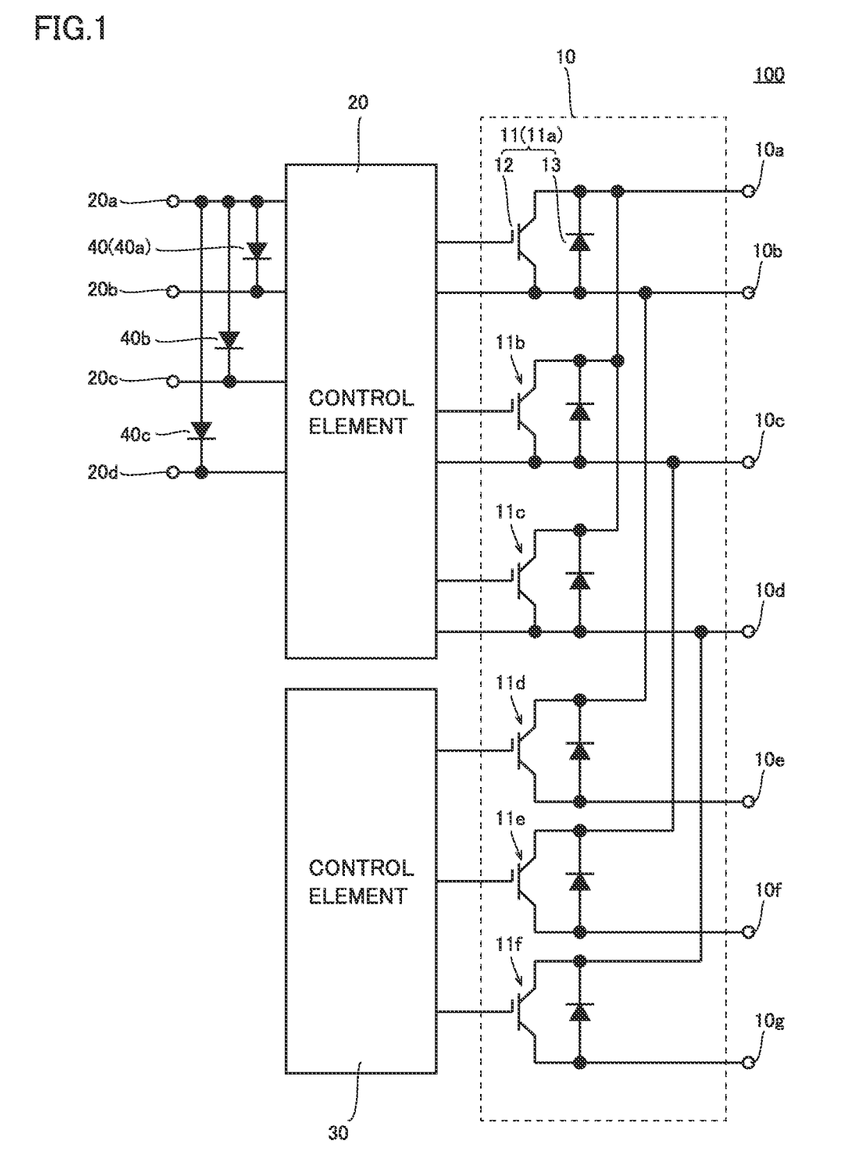
FIG. 1 is a schematic configuration diagram of a semiconductor device 100.

FIG. 1 is a schematic configuration diagram of semiconductor device 100. As shown in FIG. 1, semiconductor device 100 has an inverter circuit 10, a control element 20, a control element 30, and a plurality of bootstrap diodes 40.

Inverter circuit 10 is a three-phase inverter circuit, for example. Inverter circuit 10 has a plurality of reverse conducting IGBTs 11. In the example shown in FIG. 1, the number of reverse conducting IGBTs 11 is six. Each reverse conducting IGBT 11 has an IGBT 12 and a freewheeling diode 13. IGBT 12 and freewheeling diode 13 are formed monolithically on a single semiconductor substrate. Freewheeling diode 13 is connected to IGBT 12 so as to be reverse biased.

Inverter circuit 10 has an inverter power supply terminal 10a, an output terminal 10b, an output terminal 10c, an output terminal 10d, an output terminal 10e, an output terminal 10f and an output terminal 10g. Six reverse conducting IGBTs 11 included in inverter circuit 10 are referred to as a reverse conducting IGBT 11a, a reverse conducting IGBT 11b, a reverse conducting IGBT 11c, a reverse conducting IGBT 11d, a reverse conducting IGBT 11e and a reverse conducting IGBT 11f, respectively. A collector electrode of reverse conducting IGBT 11a, a collector electrode of reverse conducting IGBT 11b and a collector electrode of reverse conducting IGBT 11c are connected to inverter power supply terminal 10a.

An emitter electrode of reverse conducting IGBT 11a and a collector electrode of reverse conducting IGBT 11d are connected to output terminal 10b. An emitter electrode of reverse conducting IGBT 11b and a collector electrode of reverse conducting IGBT 11e are connected to output terminal 10c. An emitter electrode of reverse conducting IGBT 11c and a collector electrode of reverse conducting IGBT 11f are connected to output terminal 10d.

An emitter electrode of reverse conducting IGBT 11d, an emitter electrode of reverse conducting IGBT 11e and an emitter electrode of reverse conducting IGBT 11f are connected to output terminal 10e, output terminal 10f and output terminal 10g, respectively. Output terminal 10b and output terminal 10e are U-phase output terminals, for example, output terminal 10c and output terminal 10f are V-phase output terminals, for example, and output terminal 10d and output terminal 10g are W-phase output terminals, for example.

A gate electrode of reverse conducting IGBT 11a, a gate electrode of reverse conducting IGBT 11b and a gate electrode of reverse conducting IGBT 11c are connected to control element 20. A gate electrode of reverse conducting IGBT 11d, a gate electrode of reverse conducting IGBT 11e and a gate electrode of reverse conducting IGBT 11f are connected to control element 30. Stated another way, control element 20 is a high-voltage side control circuit, and control element 30 is a low-voltage side control circuit.

Control element 20 has a control power supply terminal 20a, a drive power supply terminal 20b, a drive power supply terminal 20c and a drive power supply terminal 20d. From control power supply terminal 20a, a control power supply voltage of control element 20 is supplied. From drive power supply terminal 20b, drive power supply terminal 20c and drive power supply terminal 20d, a drive power supply voltage of control element 20 is supplied. Drive power supply terminal 20b, drive power supply terminal 20c and drive power supply terminal 20d are for U phase, V phase and W phase, respectively. Other terminals of control element 20 and terminals of control element 30 are not shown.

Control element 20 has a level shift circuit and a gate drive circuit, and based on inputs from the respective terminals, outputs gate drive signals to reverse conducting IGBT 11a, reverse conducting IGBT 11b and reverse conducting IGBT 11c. Control element 30 has a level shift circuit and a gate drive circuit, and based on inputs from the respective terminals, outputs gate drive signals to reverse conducting IGBT 11d, reverse conducting IGBT 11e and reverse conducting IGBT 11f.

In the example shown in FIG. 1, the number of bootstrap diodes 40 is three. These three bootstrap diodes 40 are referred to as a bootstrap diode 40a, a bootstrap diode 40b and a bootstrap diode 40c. Bootstrap diode 40a is connected between control power supply terminal 20a and drive power supply terminal 20b. Bootstrap diode 40b is connected between control power supply terminal 20a and drive power supply terminal 20c. Bootstrap diode 40c is connected between control power supply terminal 20a and drive power supply terminal 20d.

Figure 2:
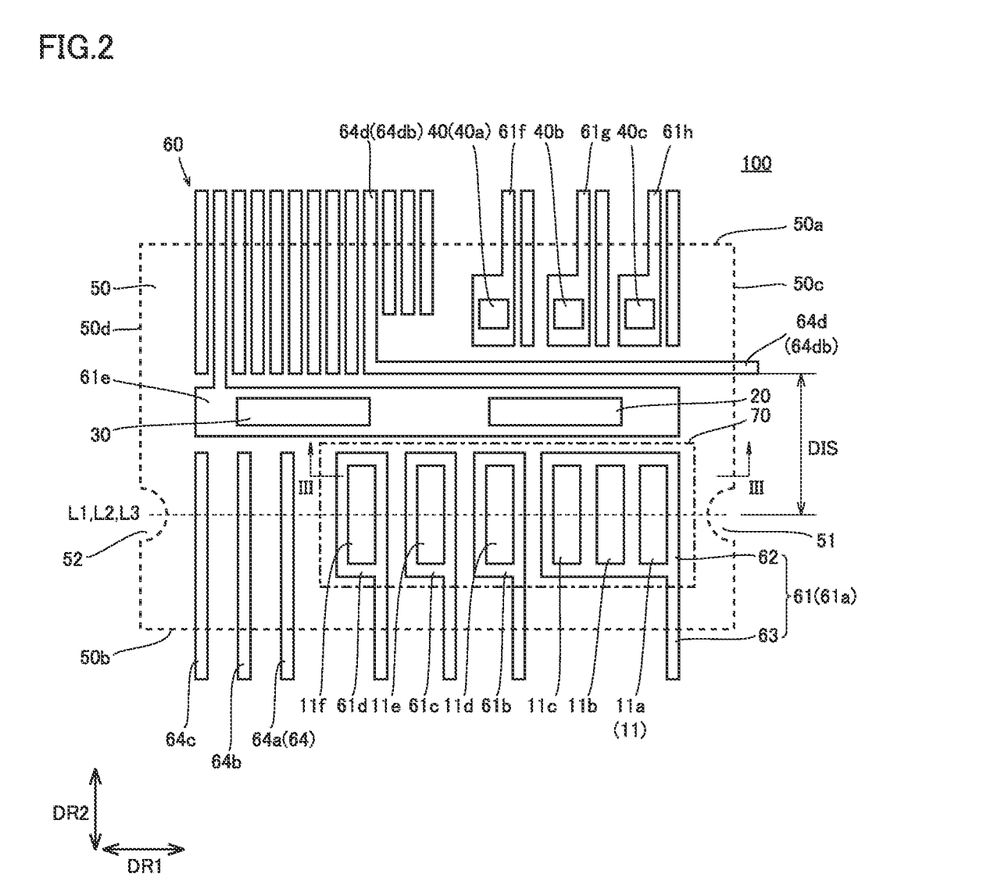
FIG. 2 is a plan view of semiconductor device 100.
Figure 3:
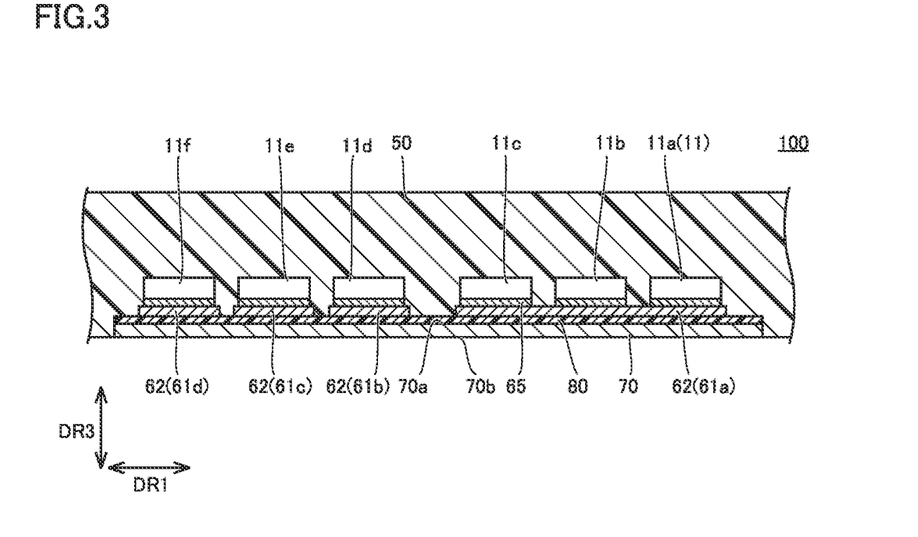
FIG. 3 is a cross-sectional view along a line III-III shown in FIG. 2.

FIG. 2 is a plan view of semiconductor device 100. A molding resin 50 is indicated by a dotted line in FIG. 2. A heatsink 70 is indicated by a chain-dotted line in FIG. 2. FIG. 3 is a cross-sectional view along a line III-III shown in FIG. 2. As shown in FIGS. 2 and 3, semiconductor device 100 has molding resin 50, a lead frame 60, heatsink 70, and an insulating sheet 80.

Molding resin 50 seals the plurality of reverse conducting IGBTs 11, control element 20, control element 30, the plurality of bootstrap diodes 40, lead frame 60, heatsink 70 and insulating sheet 80. Molding resin 50 is formed of a resin material. Molding resin 50 is preferably formed of a cure-shrinkable resin material. The cure-shrinkable resin material is a resin material that shrinks as it cures. Specific examples of the cure-shrinkable resin material include an epoxy resin.

In plan view, molding resin 50 has a rectangular shape consisting of a first side 50a and a second side 50b extending along a first direction DR1, and a third side 50c and a fourth side 50d extending along a second direction DR2. Second direction DR2 is a direction orthogonal to first direction DR1. First side 50a and second side 50b are longer than third side 50c, and are longer than fourth side 50d.

Molding resin 50 is provided with a first threaded bore 51 and a second threaded bore 52. First threaded bore 51 and second threaded bore 52 penetrate molding resin 50 along a third direction DR3. Stated another way, first threaded bore 51 and second threaded bore 52 penetrate molding resin 50 along the thickness direction. Third direction DR3 is a direction orthogonal to first direction DR1 and second direction DR2. First threaded bore 51 is located near third side 50c. First threaded bore 51 may reach third side 50c. Second threaded bore 52 is located near fourth side 50d. Second threaded bore 52 may reach fourth side 50d.

An imaginary line passing through the center of first threaded bore 51 in second direction DR2 and the center of second threaded bore 52 in second direction DR2 is referred to as a first imaginary line L1. First imaginary line L1 is along first direction DR1. First imaginary line L1 is closer to second side 50b than the center of molding resin 50 in second direction DR2.

Lead frame 60 has a plurality of frames 61. Each frame 61 has a die pad portion 62 and a lead portion 63. Lead frame 60 further has a plurality of leads 64. A frame 61 where reverse conducting IGBT 11a, reverse conducting IGBT 11b and reverse conducting IGBT 11c are disposed is referred to as a frame 61a.

A frame 61 where reverse conducting IGBT 11d is disposed, a frame 61 where reverse conducting IGBT 11e is disposed and a frame 61 where reverse conducting IGBT 11f is disposed are referred to as a frame 61b, a frame 61c and a frame 61d, respectively. A frame 61 where control element 20 and control element 30 are disposed is referred to as a frame 61e. A frame 61 where bootstrap diode 40a is disposed, a frame 61 where bootstrap diode 40b is disposed and a frame 61 where bootstrap diode 40c is disposed are referred to as a frame 61f, a frame 61g and a frame 61h, respectively.

Reverse conducting IGBT 11a, reverse conducting IGBT 11b and reverse conducting IGBT 11c are disposed on die pad portion 62 of frame 61a. A bonding material 65 is disposed between die pad portion 62 of frame 61a and reverse conducting IGBT 11a, between die pad portion 62 of frame 61a and reverse conducting IGBT 11b, and between die pad portion 62 of frame 61a and reverse conducting IGBT 11c. As a result, the collector electrode of reverse conducting IGBT 11a, the collector electrode of reverse conducting IGBT 11b and the collector electrode of reverse conducting IGBT 11c are connected to die pad portion 62 of frame 61a. Bonding material 65 is formed of a solder alloy, for example.

Lead portion 63 of frame 61a corresponds to inverter power supply terminal 10a. In plan view, lead portion 63 of frame 61a protrudes from second side 50b.

Reverse conducting IGBT 11d, reverse conducting IGBT 11e and reverse conducting IGBT 11f are disposed on die pad portions 62 of frame 61b, frame 61c and frame 61d, respectively. Bonding material 65 is disposed between die pad portion 62 of frame 61b and reverse conducting IGBT 11d, between die pad portion 62 of frame 61c and reverse conducting IGBT 11e, and between die pad portion 62 of frame 61d and reverse conducting IGBT 11f. As a result, the collector electrode of reverse conducting IGBT 11d, the collector electrode of reverse conducting IGBT 11e and the collector electrode of reverse conducting IGBT 11f are connected to die pad portions 62 of frame 61b, frame 61c and frame 61d, respectively.

The emitter electrode of reverse conducting IGBT 11a, the emitter electrode of reverse conducting IGBT 11b and the emitter electrode of reverse conducting IGBT 11c are connected to frame 61b, frame 61c and frame 61d, respectively, by bonding wires not shown in the figure.

Lead portions 63 of frame 61b, frame 61c and frame 61d correspond to output terminal 10b, output terminal 10c and output terminal 10d, respectively. In plan view, lead portions 63 of frame 61b, frame 61c and frame 61d protrude from second side 50b.

Reverse conducting IGBT 11a, reverse conducting IGBT 11b, reverse conducting IGBT 11c, reverse conducting IGBT 11d and reverse conducting IGBT 11e are arranged in a row along first direction DR1. An imaginary line passing through the centers of reverse conducting IGBT 11a, reverse conducting IGBT 11b, reverse conducting IGBT 11c, reverse conducting IGBT 11d and reverse conducting IGBT 11e in second direction DR2 is referred to as a second imaginary line L2. Second imaginary line L2 is along first direction DR1. The distance between first imaginary line L1 and second imaginary line L2 is less than or equal to 2 mm. First imaginary line L1 and second imaginary line L2 are preferably on the same line.

Control element 20 and control element 30 are disposed on die pad portion 62 of frame 61e. In plan view, control element 20 and control element 30 are aligned along first direction DR1. In plan view, control element 20 and control element 30 are closer to first side 50a than first imaginary line L1. In plan view, lead portions 63 of frames 61 protrude from first side 50a.

Bootstrap diode 40a, bootstrap diode 40b and bootstrap diode 40c are disposed on die pad portions 62 of frame 61f, frame 61g and frame 61h, respectively. In plan view, bootstrap diode 40a, bootstrap diode 40b and bootstrap diode 40c are aligned along first direction DR1. In plan view, bootstrap diode 40a, bootstrap diode 40b and bootstrap diode 40c are closer to first side 50a than control element 20 and control element 30.

Although not shown, bonding material 65 is disposed between die pad portion 62 of frame 61f and bootstrap diode 40a, between die pad portion 62 of frame 61g and bootstrap diode 40b, and between die pad portion 62 of frame 61h and bootstrap diode 40c. As a result, an anode electrode of bootstrap diode 40a, an anode electrode of bootstrap diode 40b and an anode electrode of bootstrap diode 40c are connected to die pad portions 62 of frame 61f, frame 61g and frame 61h, respectively.

Lead portions 63 of frame 61f, frame 61g and frame 61h correspond to drive power supply terminal 20b, drive power supply terminal 20c and drive power supply terminal 20d, respectively. In plan view, lead portions 63 of frame 61f, frame 61g and frame 61h protrude from first side 50a.

In plan view, some of leads 64 protrude from first side 50a, second side 50b or third side 50c. Of the plurality of leads 64, those protruding from second side 50b in plan view are referred to as a lead 64a, a lead 64b and a lead 64c. The emitter electrode of reverse conducting IGBT 11d, the emitter electrode of reverse conducting IGBT 11e and the emitter electrode of reverse conducting IGBT 11f are connected to lead 64a, lead 64b and lead 64c, respectively, by bonding wires not shown in the figure. Lead 64a, lead 64b and lead 64c correspond to output terminal 10e, output terminal 10f and output terminal 10g, respectively.

One of the plurality of leads 64 is referred to as a lead 64d. Lead 64d has a first portion 64da extending along first direction DR1 in plan view, and a second portion 64db extending along second direction DR2 in plan view. In plan view, first portion 64da passes between frames 61f, 61g, 61h and frame 61e. In plan view, an end of first portion 64da opposite to second portion 64db protrudes from third side 50c. In plan view, an end of second portion 64db opposite to first portion 64da protrudes from first side 50a.

Lead 64d is connected to control element 20 by a bonding wire not shown in the figure. Lead 64d is also connected to a cathode electrode of bootstrap diode 40a, a cathode electrode of bootstrap diode 40b and a cathode electrode of bootstrap diode 40c by bonding wires not shown in the figure. The end of first portion 64da protruding from molding resin 50 corresponds to control power supply terminal 20a.

The distance between the end of first portion 64da (control power supply terminal 20a) protruding from molding resin 50 and first imaginary line L1 is referred to as a distance DIS. Distance DIS is preferably greater than or equal to 3 mm.

Heatsink 70 is formed of a material having a high thermal conductivity. Heatsink 70 is formed of, for example, copper (Cu) or a copper alloy. An imaginary line passing through the center of heatsink 70 in second direction DR2 and extending along first direction DR1 is referred to as a third imaginary line L3. The distance between third imaginary line L3 and first imaginary line L1 is preferably less than or equal to 2 mm. Third imaginary line L3 is more preferably on the same line as first imaginary line L1.

Heatsink 70 has a first main surface 70a and a second main surface 70b. First main surface 70a and second main surface 70b are end faces of heatsink 70 in third direction DR3. Second main surface 70b is a surface opposite to first main surface 70a. Heatsink 70 is sealed in molding resin 50, with second main surface 70b exposed at a bottom surface of molding resin 50. When semiconductor device 100 is attached to a heat dissipation device such as heat dissipation fins, second main surface 70b comes into contact with the heat dissipation device.

Insulating sheet 80 is disposed on heatsink 70. More specifically, insulating sheet 80 is disposed on first main surface 70a. Insulating sheet 80 is formed of an electrically insulating material. Insulating sheet 80 is formed of, for example, a silicone resin mixed with a ceramic filler. Frame 61a, frame 61b, frame 61c and frame 61d are disposed on insulating sheet 80.

(Advantageous Effects of Semiconductor Device 100)

Advantageous effects of semiconductor device 100 are described below.

Semiconductor device 100 is attached to a heat dissipation device when screws are threaded into first threaded bore 51 and the second threaded bore and the screws are screwed into the heat dissipation device. Accordingly, the highest adhesion between semiconductor device 100 and the heat dissipation device is provided on first imaginary line L1. In semiconductor device 100, the distance between first imaginary line L1 and second imaginary line L2 is less than or equal to 2 mm. Accordingly, the centers of reverse conducting IGBTs 11 in second direction DR2 overlap, in plan view, the site of the highest adhesion between semiconductor device 100 and the heat dissipation device. In this manner, semiconductor device 100 is capable of achieving improved heat dissipation when screwed to the heat dissipation device.

When the distance between first imaginary line L1 and third imaginary line L3 is less than or equal to 2 mm, the center of heatsink 70 in second direction DR2 overlaps, in plan view, the site of the highest adhesion between semiconductor device 100 and the heat dissipation device. In this case, therefore, the adhesion between heatsink 70 and the heat dissipation device is improved, which allows for further improved heat dissipation when the semiconductor device is screwed to the heat dissipation device.

When molding resin 50 is formed of a cure-shrinkable resin material, semiconductor device 100 may warp around reverse conducting IGBTs 11 formed of a hard material. In semiconductor device 100, the distance between first imaginary line L1 and second imaginary line L2 is less than or equal to 2 mm. Accordingly, even if a cure-shrinkable resin material is used for molding resin 50, the warpage of semiconductor device 100 is corrected during the screwing to the heat dissipation device, which allows for improved heat dissipation when the semiconductor device is screwed to the heat dissipation device.

With the end of first portion 64da protruding from third side 50c and serving as control power supply terminal 20a, the size of semiconductor device 100 can be reduced. However, since a positive voltage is applied to control power supply terminal 20a, it is necessary to ensure a spatial distance and a creepage distance between control power supply terminal 20a, that is, the end of first portion 64da exposed at molding resin 50, and the screw threaded into first threaded bore 51. In semiconductor device 100, first imaginary line L1 is displaced toward second side 50b from the center of molding resin 50 in second direction DR2. Accordingly, distance DIS of greater than or equal to 3 mm can be ensured. According to semiconductor device 100, therefore, the insulation between control power supply terminal 20a and the screw threaded into first threaded bore 51 can be ensured.

(Modification)

In the above example, semiconductor device 100 was described as having reverse conducting IGBTs 11 as power semiconductor elements. However, semiconductor device 100 may have power metal oxide semiconductor field effect transistors (MOSFETs) instead of reverse conducting IGBTs 11. In addition, capacitors may be used instead of bootstrap diodes 40.

Second Embodiment

A semiconductor device according to a second embodiment is described. The semiconductor device according to the second embodiment is referred to as a semiconductor device 200. The difference from semiconductor device 100 will mainly be described here, and the same description will not be repeated.

(Configuration of Semiconductor Device 200)

The configuration of semiconductor device 200 is described below.

Figure 4:
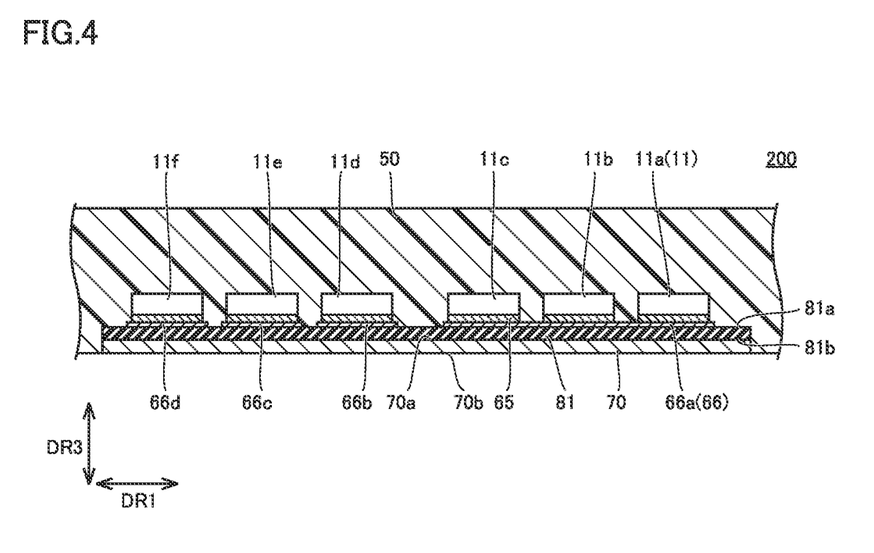
FIG. 4 is a cross-sectional view of a semiconductor device 200.

Semiconductor device 200 has, similarly to semiconductor device 100, the plurality of reverse conducting IGBTs 11, control element 20, control element 30, the plurality of bootstrap diodes 40, molding resin 50, and heatsink 70. In semiconductor device 200, too, the distance between first imaginary line L1 and second imaginary line L2 is less than or equal to 2 mm, and the distance between first imaginary line L1 and third imaginary line L3 is less than or equal to 2 mm.

FIG. 4 is a cross-sectional view of semiconductor device 200. FIG. 4 shows a cross section at a position corresponding to the line III-III shown in FIG. 2. As shown in FIG. 4, semiconductor device 200 has a plurality of conductor patterns 66 and an insulating layer 81, instead of lead frame 60 and insulating sheet 80. In this respect, the configuration of semiconductor device 200 is different from the configuration of semiconductor device 100.

Insulating layer 81 is disposed on heatsink 70. More specifically, insulating layer 81 is disposed on first main surface 70a. Insulating layer 81 has a first main surface 81a and a second main surface 81b. First main surface 81a and second main surface 81b are end faces of insulating layer 81 in third direction DR3. Second main surface 81b is a surface opposite to first main surface 81a, and faces heatsink 70. Insulating layer 81 is formed of an electrically insulating material. Insulating layer 81 is formed of ceramic, for example.

Conductor patterns 66 are disposed on insulating layer 81. More specifically, conductor patterns 66 are disposed on first main surface 81a. One of the plurality of conductor patterns 66 where reverse conducting IGBT 11a, reverse conducting IGBT 11b and reverse conducting IGBT 11c are disposed is referred to as a conductor pattern 66a. One of the plurality of conductor patterns 66 where reverse conducting IGBT 11d is disposed, one of the plurality of conductor patterns 66 where reverse conducting IGBT 11e is disposed, and one of the plurality of conductor patterns 66 where reverse conducting IGBT 11f is disposed are referred to as a conductor pattern 66b, a conductor pattern 66c and a conductor pattern 66d, respectively.

Bonding material 65 is disposed between conductor pattern 66a and reverse conducting IGBT 11a, between conductor pattern 66a and reverse conducting IGBT 11b, and between conductor pattern 66a and reverse conducting IGBT 11c. Bonding material 65 is also disposed between conductor pattern 66b and reverse conducting IGBT 11d, between conductor pattern 66c and reverse conducting IGBT 11e, and between conductor pattern 66d and reverse conducting IGBT 11f.

(Advantageous Effects of Semiconductor Device 200)

Advantageous effects of semiconductor device 200 are described below.

In semiconductor device 200, the distance between first imaginary line L1 and second imaginary line L2 is less than or equal to 2 mm, and the distance between first imaginary line L1 and third imaginary line L3 is less than or equal to 2 mm. Accordingly, in semiconductor device 200, too, the centers of reverse conducting IGBTs 11 in second direction DR2 and the center of heatsink 70 in second direction DR2 overlap, in plan view, the site of the highest adhesion between semiconductor device 200 and the heat dissipation device. In this manner, semiconductor device 200 is also capable of achieving improved heat dissipation when screwed to the heat dissipation device.

While the embodiments of the present disclosure have been described, it should be understood that the embodiments disclosed herein are illustrative and non-restrictive in every respect. The scope of the present disclosure is defined by the terms of the claims, and is intended to include any modifications within the meaning and scope equivalent to the terms of the claims.

What is claimed is:

1. A semiconductor device comprising:
   a power semiconductor element; and
   a molding resin sealing the power semiconductor element, wherein in plan view, the molding resin has a rectangular shape consisting of a first side and a second side extending along a first direction, and a third side and a fourth side extending along a second direction orthogonal to the first direction, the first side is longer than the third side, the molding resin is provided with a first threaded bore and a second threaded bore, the first threaded bore and the second threaded bore penetrating the molding resin along a third direction orthogonal to the first direction and the second direction, a first imaginary line extends along the first direction, and is closer to the second side than a center of the molding resin in the second direction, the first imaginary line passing through a center of the first threaded bore in the second direction and a center of the second threaded bore in the second direction, and a distance between a second imaginary line and the first imaginary line is less than or equal to 2 mm, the second imaginary line passing through a center of the power semiconductor element in the second direction and extending along the first direction.

2. The semiconductor device according to claim 1, further comprising a bootstrap diode, a first terminal and a second terminal that are sealed in the molding resin, wherein the first terminal partially protrudes from the first side along the second direction, the second terminal partially protrudes from the third side along the first direction, and the first terminal and the second terminal are electrically connected to each other via the bootstrap diode.

3. The semiconductor device according to claim 2, wherein a distance between the second terminal and the first imaginary line is greater than or equal to 3 mm.

4. The semiconductor device according to claim 1, wherein the molding resin is formed of a cure-shrinkable resin material.

5. The semiconductor device according to claim 1, further comprising:

a heatsink;

an insulating sheet disposed on the heatsink;

a lead frame having a die pad disposed on the insulating sheet; and a bonding material disposed on the die pad, wherein the heatsink, the insulating sheet and the lead frame are sealed in the molding resin such that the heatsink is exposed at a bottom surface of the molding resin, the power semiconductor element is disposed on the bonding material, and a distance between a third imaginary line and the first imaginary line is less than or equal to 2 mm, the third imaginary line passing through a center of the heatsink in the second direction and being along the first direction.

6. The semiconductor device according to claim 1, further comprising:

a heatsink;

an insulating layer disposed on the heatsink;

a conductor pattern disposed on the insulating layer; and a bonding material disposed on the conductor pattern, wherein the heatsink, the insulating layer and the conductor pattern are sealed in the molding resin such that the heatsink is exposed at a bottom surface of the molding resin, the power semiconductor element is disposed on the bonding material, and a distance between a third imaginary line and the first imaginary line is less than or equal to 2 mm, the third imaginary line passing through a center of the heatsink in the second direction and being along the first direction.

7. The semiconductor device according to claim 1, wherein the power semiconductor element is a reverse conducting IGBT.

8. The semiconductor device according to claim 1, further comprising:

a heatsink, wherein a distance between a third imaginary line and the first imaginary line is less than or equal to 2 mm, the third imaginary line passing through a center of the heatsink in the second direction and being along the first direction.

* * * * *